(12) United States Patent
Furukawa et al.

(10) Patent No.: US 7,250,351 B2
(45) Date of Patent: Jul. 31, 2007

(54) ENHANCED SILICON-ON-INSULATOR (SOI) TRANSISTORS AND METHODS OF MAKING ENHANCED SOI TRANSISTORS

(75) Inventors: Toshiharu Furukawa, Essex Junction, VT (US); Carl John Radens, LaGrangeville, NY (US); William Robert Tonti, Essex Junction, VT (US); Richard Quimby Williams, Essex Junction, VT (US)

(73) Assignee: International Business Machines Corporation, Armonk, NY (US)

( * ) Notice: Subject to any disclaimer, the term of this patent is extended or adjusted under 35 U.S.C. 154(b) by 1 day.

(21) Appl. No.: 11/106,002

(22) Filed: Apr. 14, 2005

(65) Prior Publication Data

US 2006/0231892 A1 Oct. 19, 2006

(51) Int. Cl.
*H01L 29/76* (2006.01)

(52) U.S. Cl. ............... 438/423; 438/149; 438/439; 438/452; 257/347

(58) Field of Classification Search ........... 438/149, 438/423, 439, 452
See application file for complete search history.

(56) References Cited

U.S. PATENT DOCUMENTS

2003/0223258 A1  12/2003  Wei et al.
2005/0116290 A1*  6/2005  de Souza et al. ........... 257/347

* cited by examiner

*Primary Examiner*—Edward Wojciechowicz
(74) *Attorney, Agent, or Firm*—Joan Pennington

(57) ABSTRACT

Enhanced silicon-on-insulator transistors and methods are provided for implementing enhanced silicon-on-insulator transistors. The enhanced silicon-on-insulator (SOI) transistors include a thin buried oxide (BOX) layer under a device channel and a thick self-aligned buried oxide (BOX) region under SOI source/drain diffusions. A selective epitaxial growth is utilized in the source/drain regions to implement appropriate strain to enhance both PFET and NFET devices simultaneously.

19 Claims, 23 Drawing Sheets

ENHANCED SILICON-ON-INSULATOR (SOI) TRANSISTORS AND METHODS OF MAKING ENHANCED SOI TRANSISTORS

FIELD OF THE INVENTION

The present invention relates generally to the field of semiconductor manufacturing and, more specifically, to enhanced silicon-on-insulator transistors and a method for implementing enhanced silicon-on-insulator transistors.

DESCRIPTION OF THE RELATED ART

Silicon-on-insulator (SOI) transistors provide better performance at low operating voltages than do transistors of similar dimensions fabricated in bulk silicon substrates. Superior performance of SOI transistors at low operating voltage is related to the relatively lower junction capacitances obtained on an SOI device as compared to a bulk silicon device of similar dimensions. A buried oxide layer in an SOI device separates active transistor regions from the bulk silicon substrate, reducing junction capacitance.

Various SOI transistor arrangements are known. For example, Wei et al., U.S. patent application Publication No. US 2003/0223258 published Dec. 4, 2003, and assigned to the present assignee, discloses a method comprising forming a gate electrode above an SOI substrate comprised of a bulk substrate, a buried insulation layer and an active layer, the gate electrode having a protective layer formed thereabove, and forming a plurality of dielectric regions in the bulk substrate after the gate electrode is formed, the dielectric regions being self-aligned with respect to the gate electrode, the dielectric regions having a dielectric constant that is less than a dielectric constant of the bulk substrate. In other embodiments, the method comprises forming a gate electrode above an SOI substrate comprised of a bulk substrate, a buried insulation layer and an active layer, the gate electrode having a protective layer formed thereabove, performing at least one oxygen implant process after the gate electrode and the protective layer are formed to introduce oxygen atoms into the bulk substrate to thereby form a plurality of oxygen-doped regions in the bulk substrate, and performing at least one anneal process to convert the oxygen-doped regions to dielectric regions comprised of silicon dioxide in the bulk substrate. In one illustrative embodiment, the device comprises a gate electrode formed above an SOI structure comprised of a bulk substrate, a buried insulation layer, and an active layer, and a plurality of dielectric regions comprised of silicon dioxide formed in the bulk substrate, the dielectric regions being self-aligned with respect to the gate electrode.

U.S. Pat. No. 6,287,901 to Christensen et al., issued Sep. 11, 2001, and assigned to the present assignee, discloses a method and semiconductor structure which are provided for implementing dual plane body contacts for silicon-on-insulator (SOI) transistors. A bulk silicon substrate is provided. A deep ion implant layer is implanted to reside below an oxide insulator. An oxygen implant layer is implanted while applying a mask to block the oxygen implant layer in selected regions. The selected regions provide for body contact for the SOI transistors. Holes are formed extending into the deep ion implant layer and the bulk silicon substrate. The holes are filled with an electrically conductive material to create stud contacts to the deep ion implant layer and the bulk silicon substrate.

While the above disclosed methods and SOI structures provide improvements over prior art arrangements, a need exists for enhanced silicon-on-insulator (SOI) transistors and methods for manufacturing thereof. It is desirable to provide such enhanced silicon-on-insulator transistors having both negligible voltage threshold change with body potential changes and negligible diffusion area capacitance during nominal operation conditions, and thus improved performance.

SUMMARY OF THE INVENTION

Principal aspects of the present invention are to provide enhanced silicon-on-insulator transistors and methods for implementing enhanced silicon-on-insulator transistors. Other important objects of the present invention are to provide such enhanced silicon-on-insulator transistors and methods for implementing enhanced silicon-on-insulator transistors substantially without negative effect and that overcome some of the disadvantages of prior art arrangements.

In brief, enhanced silicon-on-insulator transistors and methods are provided for implementing enhanced silicon-on-insulator transistors. The enhanced silicon-on-insulator (SOI) transistors include a thin buried oxide (BOX) layer under a device channel and a thick self-aligned buried oxide (BOX) region under SOI source/drain diffusions. Selective strain is generated in the source/drain regions for enhanced carrier mobility for both P-channel and N-channel devices.

A selective epitaxial (epi) growth is utilized in the source/drain regions to implement appropriate strain to enhance both PFET and NFET devices simultaneously. A selective epi silicon germanium (SiGe) growth for PFETs or a selective epi silicon carbide (SiC) growth for NFETs is provided to form the source/drain regions. Oxygen implants below SOI source/drain regions are provided to form the thick self-aligned buried oxide (BOX) region under SOI source/drain diffusions.

In accordance with features of one embodiment of the invention, a process step etches a silicon layer in the source/drain regions, leaving a seed layer. The oxygen implant step is performed through the seed layer before the source/drain regions are grown, so that the energy level of the oxygen implant step is minimized. Then a process step regrows a silicon containing material for the source/drain regions on the seed layer, while enabling the integration of appropriate strained silicon for both PFET and NFET devices.

In accordance with features of other embodiments of the invention, a damascene gate process is implemented with a gate electrode and a gate oxide formed after an oxygen implant step is performed for avoiding any damage to the gate dielectric. Advantages are that one can create a weak gate, i.e., a gate with slightly lower drive currents, and that one can decouple the source/drain from the gate stack process. This weak gate also is called a wimpy gate. These advantages can integrate both standard polysilicon gates with conventional gate dielectrics such as silicon dioxide and silicon oxynitride, and with metal gates with high-dielectric constant (high-K) materials such as hafnium oxide, hafnium oxynitrde, and the like, on, the same substrate with low junction capacitance and an effective back gate.

In accordance with features of other embodiments of the invention, a new dual-gate structure is provided with a front gate comprising of a high K dielectric and metal gate stack, and a back gate comprising of $SiO_2$ and silicon gate stack. The differentiating and novel features of this structure are that it is a planar double gate device with significantly different gate oxide and gate material on each side of the channel. These two different gate stacks give the device the ability to operate with either the front or the back channel functioning, or both, depending on the thickness of the silicon layer, the bias conditions, and the materials used. This dual-gate device also provides an enhanced reliability device when the back gate is used to enhance how the device progresses through the burn-in process. By optimizing back gate properties to withstand elevated voltages, the device burn-in can be accelerated in a way that most conventional fails are detected, for example, metal defects, mobile ions, wiring dielectric issues, negative temperature bias instability, and the like.

In accordance with features of one embodiment of the invention, a damascene gate is used to self-align the thick BOX region to the SOI source/drain diffusion areas.

In accordance with features of one embodiment of the invention, a thick shallow trench isolation (STI) region is formed over a thin BOX layer. The oxygen implant step is performed using a damascene gate to self-align the thick BOX region to the SOI source/drain diffusion areas. The thick STI regions are used to mask the BOX implants at device edges of the SOI source/drain diffusion areas.

In accordance with features of one embodiment of the invention, a polysilicon region and a pad oxide are provided for defining a damascene gate region. After the thick BOX regions are formed and the source/drain are formed, the sacrificial polysilicon region is covered by a molding material, such as, silicon nitride and is chemical-mechanically polished to exposed the top of the sacrificial polysilicon. Then the polysilicon and a pad oxide are stripped. A gate dielectric and a gate electrode are deposited. This manufacturing process enables the use of a gate dielectric having a high dielectric constant, such as $3.1 < K \leq 30$, deposited when no further high temperature processes are required.

BRIEF DESCRIPTION OF THE DRAWINGS

The present invention together with the above and other objects and advantages may best be understood from the following detailed description of the preferred embodiments of the invention illustrated in the drawings, wherein:

FIGS. 5-7A and 7B, 8-12A and 12B are diagrams not to scale illustrating exemplary steps for implementing enhanced silicon-on-insulator (SOI) transistors in accordance with another preferred embodiment; and FIGS. 13-20A and 20B are diagrams not to scale illustrating exemplary steps for implementing enhanced silicon-on-insulator (SOI) transistors in accordance with still another preferred embodiment.

DETAILED DESCRIPTION OF THE PREFERRED EMBODIMENTS

In accordance with features of a preferred embodiment, enhanced silicon-on-insulator (SOI) transistors include a thick self-aligned buried oxide (BOX) region under SOI source/drain (S/D) diffusions while maintaining a thin BOX under the silicon body for good backside coupling. A self-aligned epitaxial (epi) growth is utilized in the S/D regions with appropriate strain to enhance PFET and NFET devices simultaneously. Simultaneous enhancement of SOI devices is provided through selective strain and also by reducing diffusion area capacitance Cja while maintaining good back-gate coupling.

In accordance with features of the preferred embodiment, either a thick or a thin active Si region is supported. An offset region to channel is employed. Source/drain regions are implemented with appropriate strain for mobility improvement for both PFET and NFET devices. Optionally uniform composition silicon (a homogeneous material) can be used in the source/drain regions.

Figure 1:
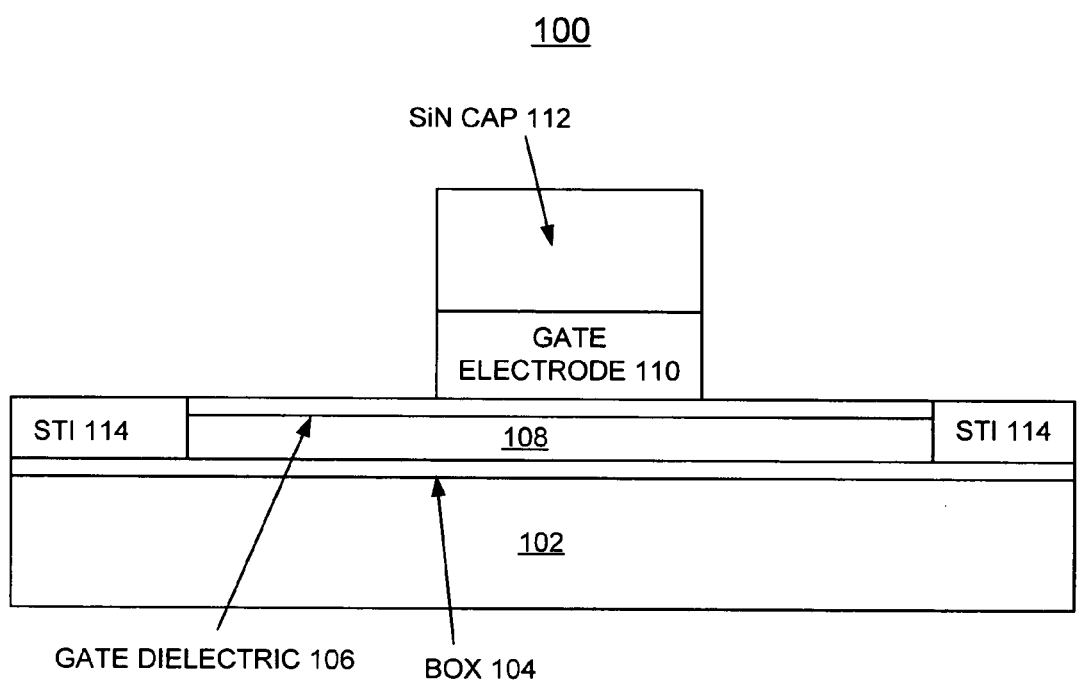
FIGS. 1-4 are diagrams not to scale illustrating exemplary steps for implementing enhanced silicon-on-insulator (SOI) transistors in accordance with one preferred embodiment.

Referring now to the drawings, in FIG. 1 there is shown an exemplary structure generally designated by the reference character 100 for forming enhanced SOI transistors of one preferred embodiment. Structure 100 includes a substrate 102, such as a silicon substrate 102, a very thin buried oxide or oxynitride (BOX) layer 104 of thickness range 2 nm to 10 nm, a gate insulation layer or gate dielectric 106 of EOT (electrically Equivalent Oxide Thickness) of 0.9 nm to 2 nm, an active layer or silicon layer 108 of thickness range 5 nm to 750 nm, and a gate electrode 110, such as polysilicon or a metal gate electrode 110 of thickness range 10 nm to 100 nm. A protective layer 112, such as a silicon nitride $Si_3N_4$ cap 112 of thickness range 50 nm to 100 nm is formed above the gate electrode 110 of thickness range 13 nm to 30 nm preferably 18 nm, for example, that was etched in-situ. Shallow trench isolation (STI) region 114 is formed over the BOX layer 104. STI region 114 is continuous around the active device region.

Figure 2:
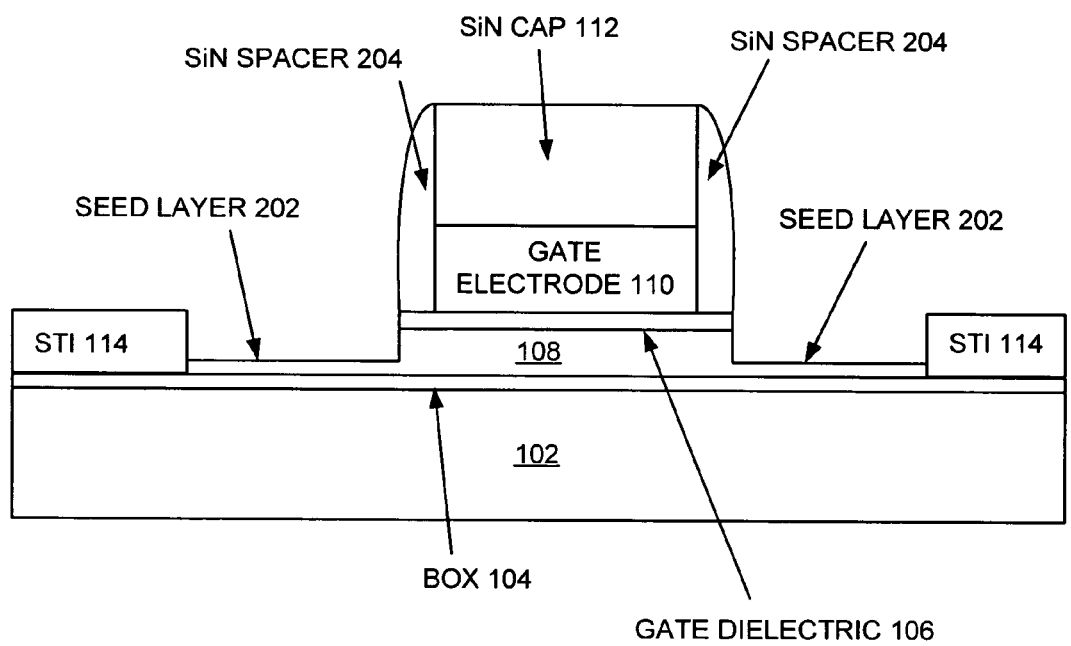

Referring now to FIG. 2, there is shown a next exemplary structure 200 where the active silicon layer 108 is etched, leaving a seed layer 202 of thickness of 2 nm to 20 nm, preferably 5 nm, for forming the source and drain on opposed sides of the channel or body 108 of the SOI transistor. Optional protective $Si_3N_4$ spacers 204 are formed on the sidewalls of the gate electrode 110 and the protective cap 112. The spacer thickness can be adjusted to control the distance between the thick BOX and the active device channel area as shown in FIG. 4.

Figure 3:
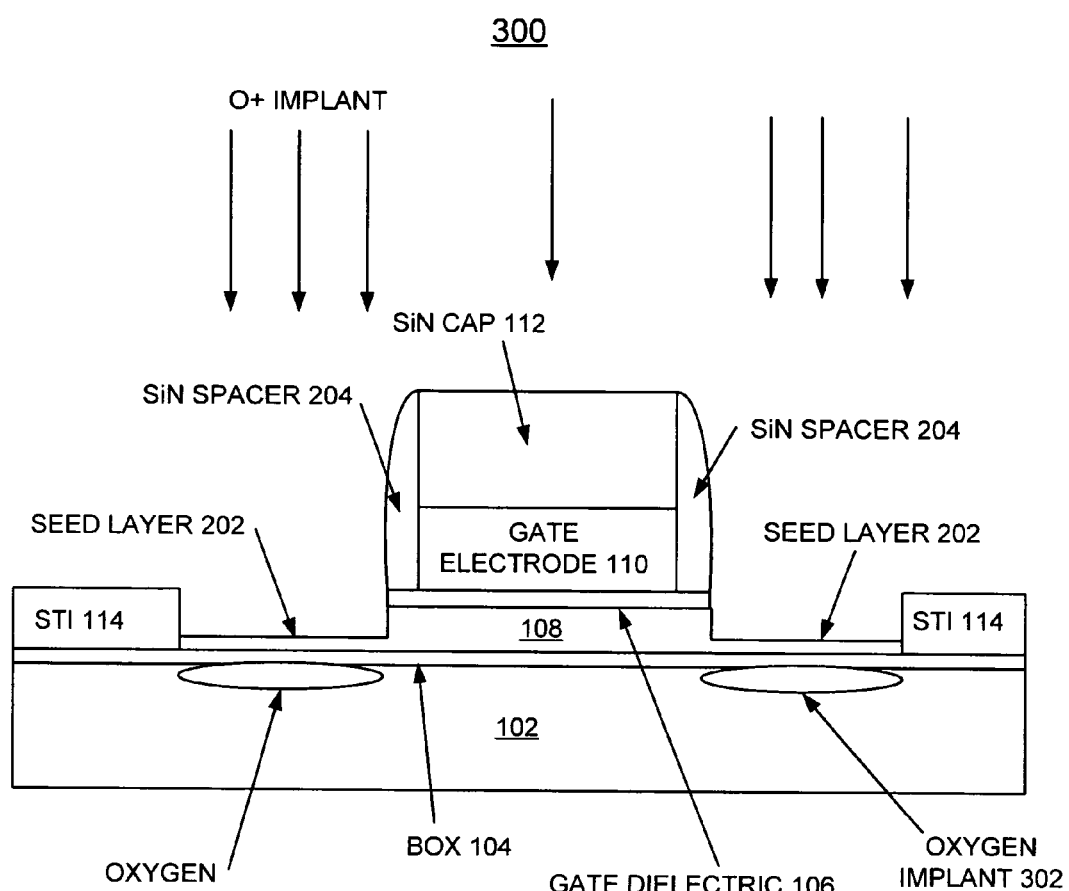

Referring now to FIG. 3, there is shown a next exemplary structure 300 where an oxygen implant step is performed as indicated by arrows O+implant to provide a pair of respective oxygen implants 302 into the bulk substrate 102 in regions under the seed layer 202 that are later used for forming source and drain of the SOI transistor. The oxygen implant process is self-aligned with respect to the gate electrode 110 and the STI regions 114. The oxygen implant step through the seed layer is provided at a selected dose and energy level for forming respective oxygen implants slightly below or vertically adjacent to SOI source/drain regions. The oxygen implant step through the seed layer is provided, for example, at an energy level in a range from 20 to 200 KeV using a dose of in the range of $10^{16}$ cm$^{-2}$ to several $10^{18}$ cm$^{-2}$.

Figure 4:
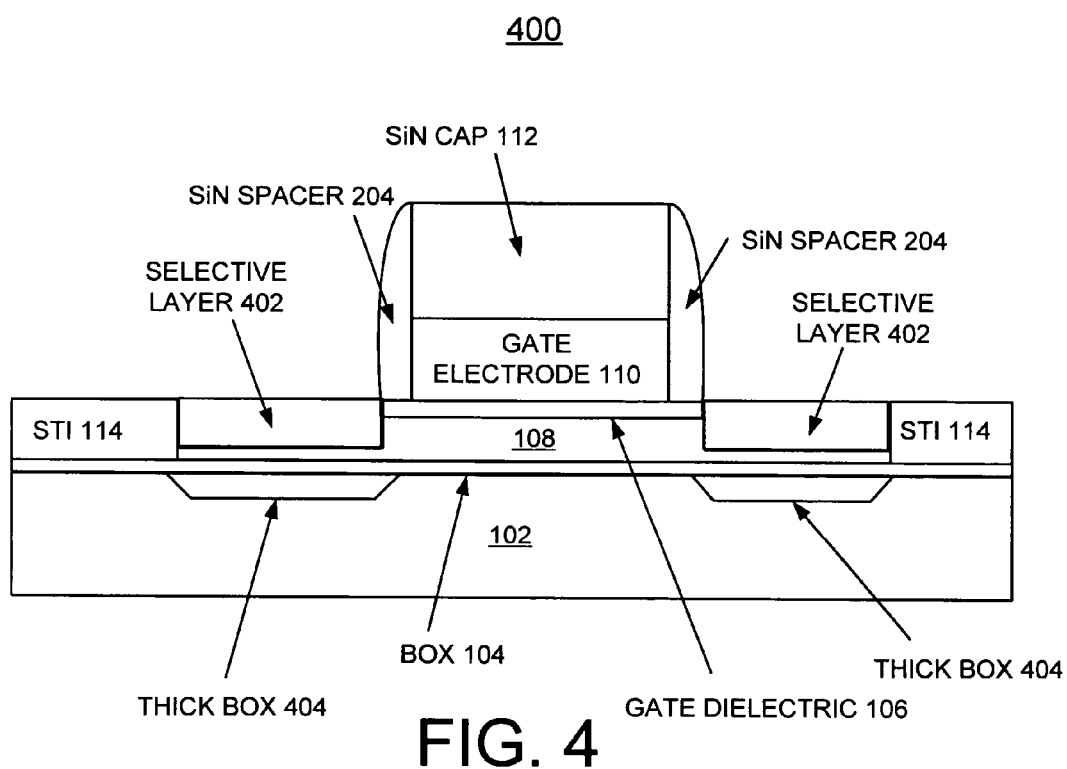

Referring now to FIG. 4, there is shown a next exemplary structure 400 where an epitaxial Si growth can be provided to fill back the seed layer 202 to form a S/D selective diffusion layer 402 defining the source and drain. Additionally, for appropriate PFET and NFET strain, a selective epi SiGe growth for PFETs or a selective epi SiC growth for NFETs is provided to form the S/D selective diffusion layer 402. For selective SiGe epi growth a combination of dichlorosilane (DCS), gaseous hydrogen chloride (HCL), germanium hydride ($GeH_4$) are used at a temperature of 680° C.-750° C. For in-situ doped selective silicon, for example, DCL, HCL, and silicon diborane are used with a growth temperature of 620° C.-680° C. For silicon carbide, methyl silane can be introduced with the appropriate process adjustments.

A tensile strain resulting from the selective epi SiC growth for NFETs increases the mobility of carriers in N-channel MOSFETs. A compressive strain resulting from the selective epi SiGe growth for PFETs increases the mobility of carriers in P-channel MOSFETs. It should be understood that the source and drain selective diffusion layer 402 can be grown with other selective silicon containing materials while providing appropriate strain for mobility improvement for both PFET and NFET devices. In addition pure silicon can be used as the replacement material having minimized the implant conditions.

Prior to the above epi growth in FIG. 4, an anneal process is performed to convert the oxygen implants 302 to respective thick box region 404 at a temperature between 600° C. to 1350° C., preferably in a temperature range between 900° C. and 1100° C., for a period of several minutes to 10 hours. Optionally a thin thermal oxide is grown on the exposed seed regions 202 to improve the resulting material quality. The thin oxide is then stripped prior to the source/drain selective epi growth. The thick box 404 is located always beneath the source and drain, and is defined such that the diffusion area capacitance component is negligible when the circuit operation at nominal conditions. This is electrically measurable during circuit operates at nominal conditions. The thin box 104 is always also located beneath the MOS channel or body 108. The thin BOX layer 104 is defined as sufficiently thin enough to suppress significant threshold change when the body potential changes. Alternatively, ramping the backside potential or potential of substrate 102 should couple to the threshold in an electrically measurable way.

As shown in FIG. 4, the resulting enhanced SOI transistor structure 400 is provided having the thick oxide region 404 under the selective epi source/drain 402 and the thin region 104 under the body or channel region 108. The resulting enhanced SOI transistor 400 includes simultaneous enhancement through selective strain of selective epi source/drain 402 and also by reducing the diffusion area capacitance Cja while maintaining good backgate coupling. An advantage provided is that both thick or thin active Si region 108 is supported. A self-aligned offset region to the channel is employed, that is the distance between the active region 108 and the selective layer 402 is controlled by the $Si_3N_4$ spacers 204. This allows for using strain enhancing species in the selective layer 402 that will be decoupled from the actual junction depletion region which will occupy the distance between the selective layer 402 and the active region 108 and will extend under the gate electrode 110. Source/drain regions are implemented with appropriate strain for mobility improvement for both PFET and NFET devices. Subsequent to these steps conventional front-end-of-line (FEOL) processing steps are used to complete the transistor. These steps can include but are not limited to source/drain implants, extension implants, silicide formation on the gate, source, and drain, and contact formation (not shown).

Referring now to FIGS. 5-7A, 7B, 8-12A and 12B there are shown exemplary steps for implementing enhanced silicon-on-insulator (SOI) transistors in accordance with another preferred embodiment. A thick self-aligned BOX region is provided under SOI source/drain diffusions while maintaining a thin box under the Si body for good backside coupling. This method utilizes a damascene gate process to self-align the thick box regions to the source and drain diffusion areas. This method uses thick shallow trench isolation (STI) regions to mask BOX implants at device edges. Note that these thick STI regions could also be thin STI regions with at least one patterned dielectric layer above, for example, a nitride.

Figure 5:
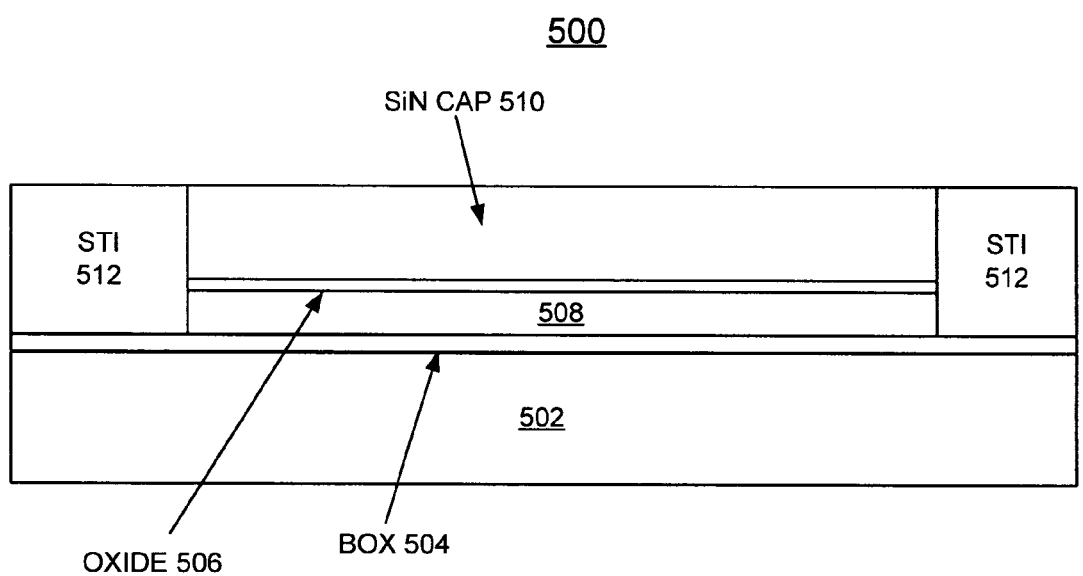

Referring now to FIG. 5, there is shown an exemplary structure generally designated by the reference character 500 for forming enhanced SOI transistors of this preferred embodiment. Structure 500 includes a substrate 502, such as a silicon substrate 502, a very thin buried oxide or oxynitride (BOX) layer 504, a pad oxide layer 506, an active layer or silicon layer 508, and a protective layer 510, such as silicon nitride $Si_3N_4$. A shallow trench isolation (STI) region 512 is formed over the BOX layer 504.

Figure 6:
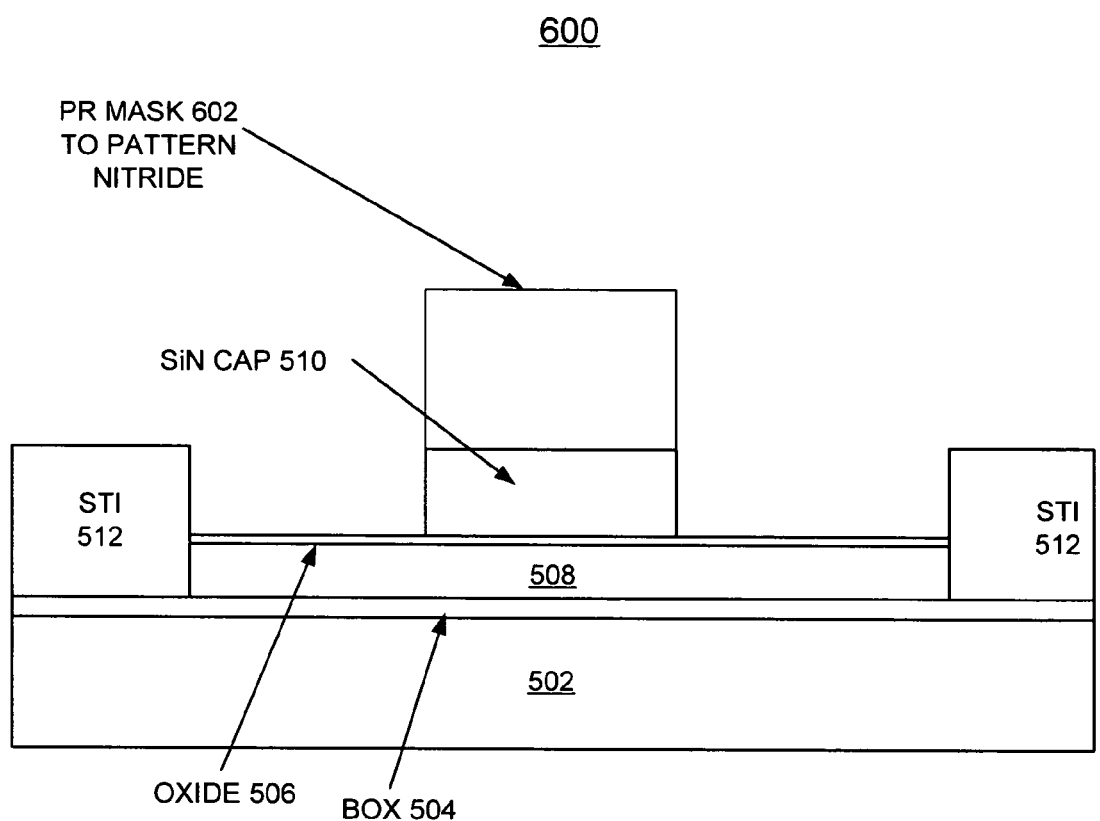
Figure 12A:
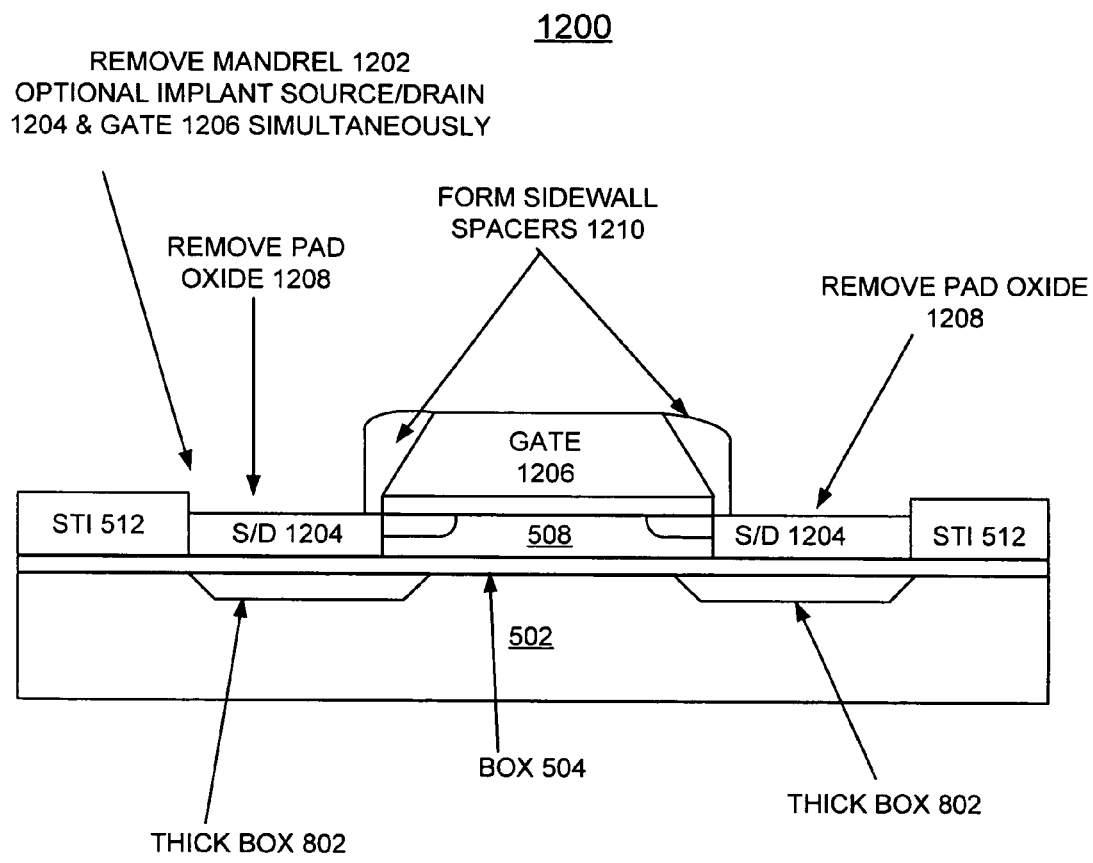
Figure 12B:
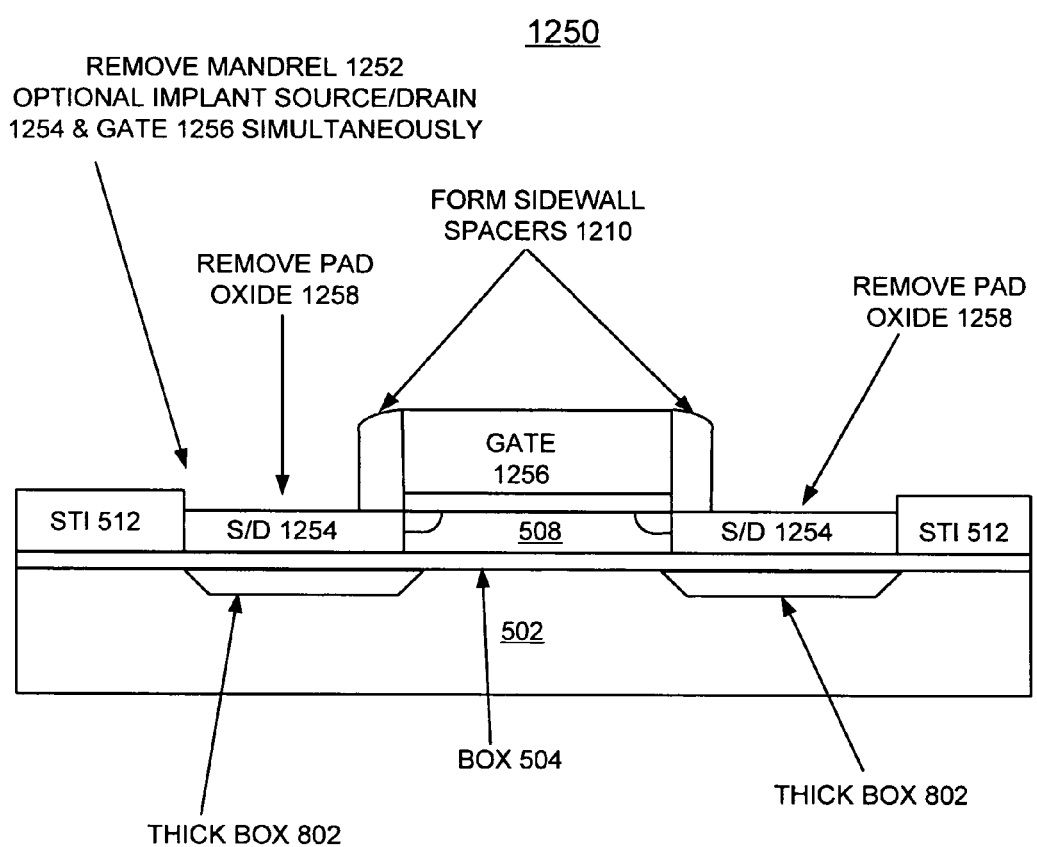

Referring to FIG. 6, there is shown a next exemplary structure 600 where a photo-resist (PR) mask 602 is provided to pattern the silicon nitride $Si_3N_4$ cap 510 for later forming a gate electrode, for example, as shown in FIG. 12A or FIG. 12B.

Figure 7A:
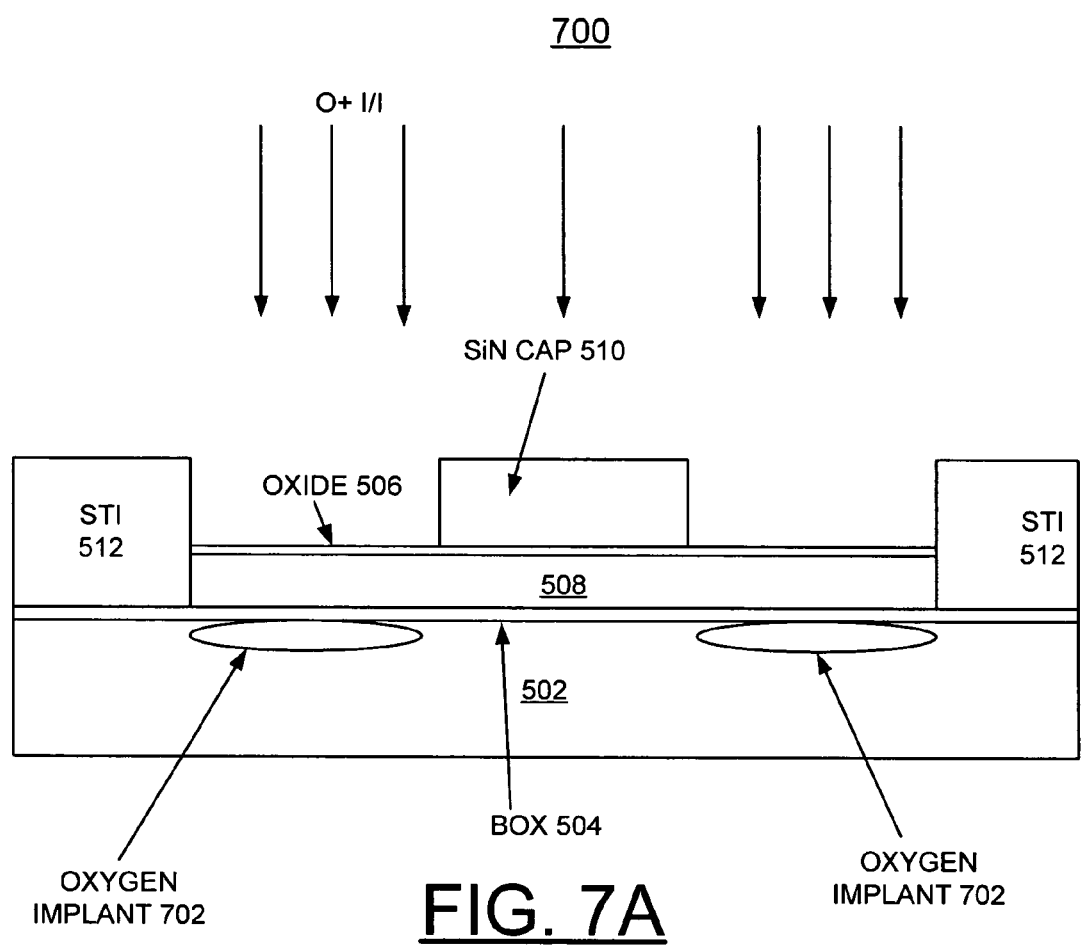

Referring now to FIG. 7A, there is shown a next exemplary structure 700 where an oxygen implant step, for example, 50 to 200 KeV using a dose in the range of $10^{16}$ cm$^{-2}$ to several $10^{18}$ cm$^{-2}$, is performed as indicated by arrows O+I/I to provide respective oxygen implants 702 into the bulk substrate 502 under regions that are later used for forming source and drain of the SOI transistor that are between the patterned $Si_3N_4$ cap 510 and the STI regions 512. The oxygen implant process is self-aligned with respect to the $Si_3N_4$ cap 510 and the thick STI regions 512 mask the BOX implants at source/drain device edges. It should be understood that the source/drain formation can also include a compound such as SiGe or SiC as described in the previous embodiment.

Figure 7B:
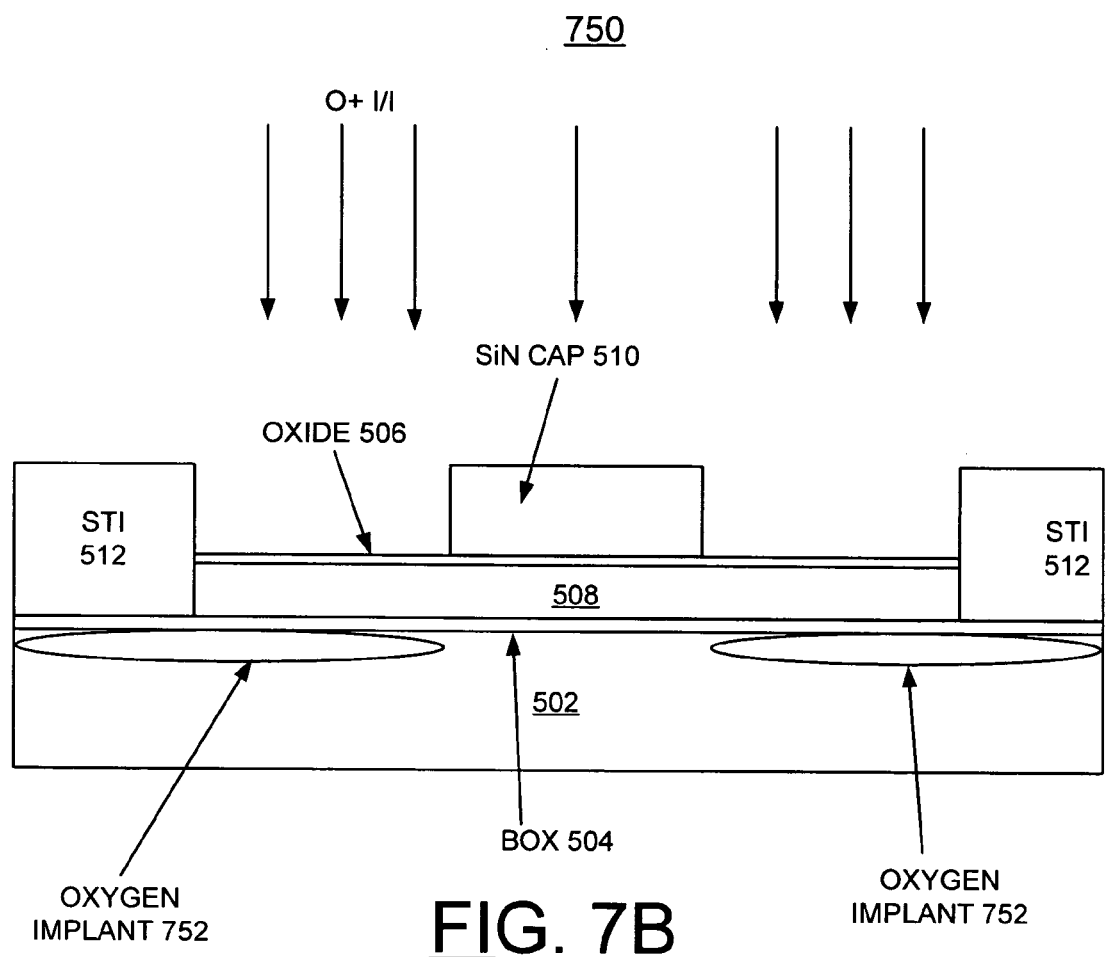

Referring now to FIG. 7B, there is shown another exemplary structure 750 illustrating how additional electrical isolation is achieved adjacent to the active transistor area 508 by allowing a respective oxygen implant 752 to extend beneath STI region 512. The oxygen implant step through the STI region 512 and under regions that are later used for forming source and drain of the SOI transistor is provided at a selected dose and energy level for forming respective oxygen implants 752 under SOI source/drain regions and the STI regions. Note that multiple implants requiring additional masks can optionally be used to accomplish the structure in FIG. 7B. To get the O+implant under the STI region 512, the STI should be about the same thickness as the SOI layers plus the pad oxide in FIG. 7B.

Figure 8:
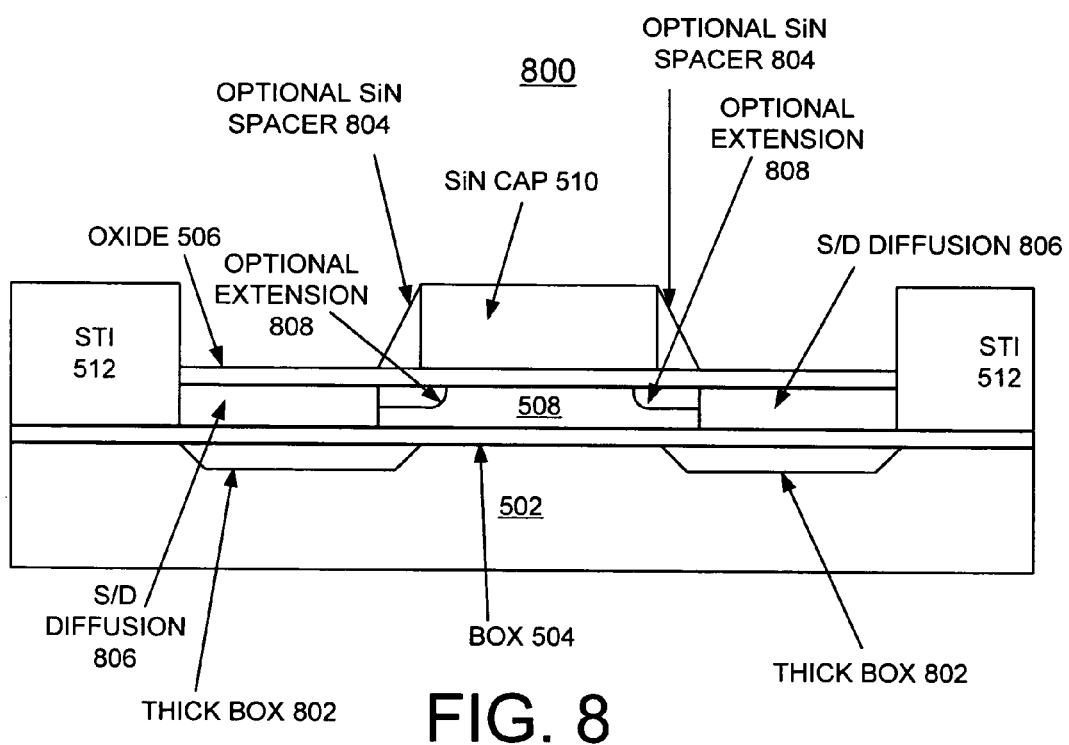

Referring now to FIG. 8, there is shown a next exemplary structure 800 where an anneal process is performed to convert the oxygen implants 702 to a respective thick box region 802 at temperatures between 900 to 1400 for a period of several minutes to 10 hours The thick box 802 is located always beneath regions that form the source and drain, and also is defined such that the diffusion area capacitance component is negligible when the circuit operates under nominal conditions. An optional silicon nitride $Si_3N_4$ spacer 804 is formed on the sides of the $Si_3N_4$ cap 510 that is used for forming a longer (or weak) gate, such as illustrated and described with respect to FIG. 12A. For a standard gate, no nitride spacers are formed. Also the source and drain can optionally be implanted at this point as indicated by source and drain (S/D) diffusion 806. The source and drain (S/D) diffusion 806 can include an optional extension 808 extending below the $Si_3N_4$ cap 510.

Figure 9:
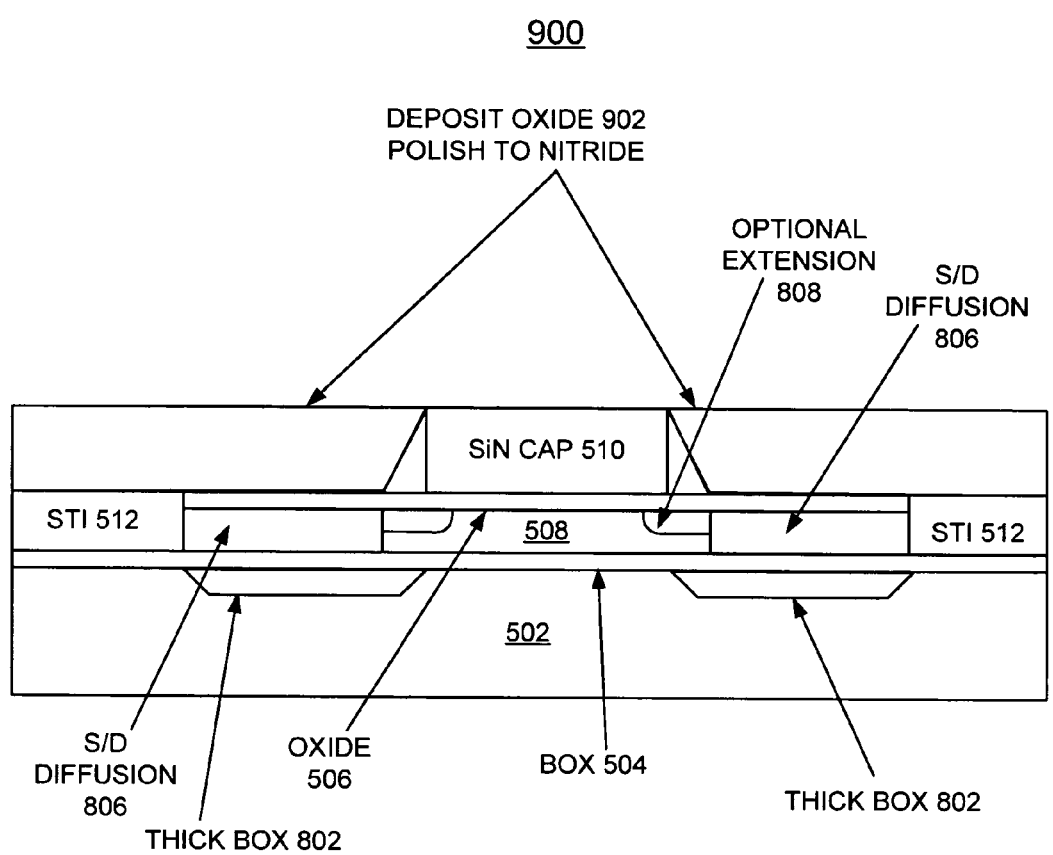

Referring now to FIG. 9, there is shown a next exemplary structure 900 where in a next process step, optionally the STI 512 is etched to ensure that its height is below that of the gate stack, and an oxide 902 is deposited and polished to the top surface of nitride cap 510.

Figure 10:
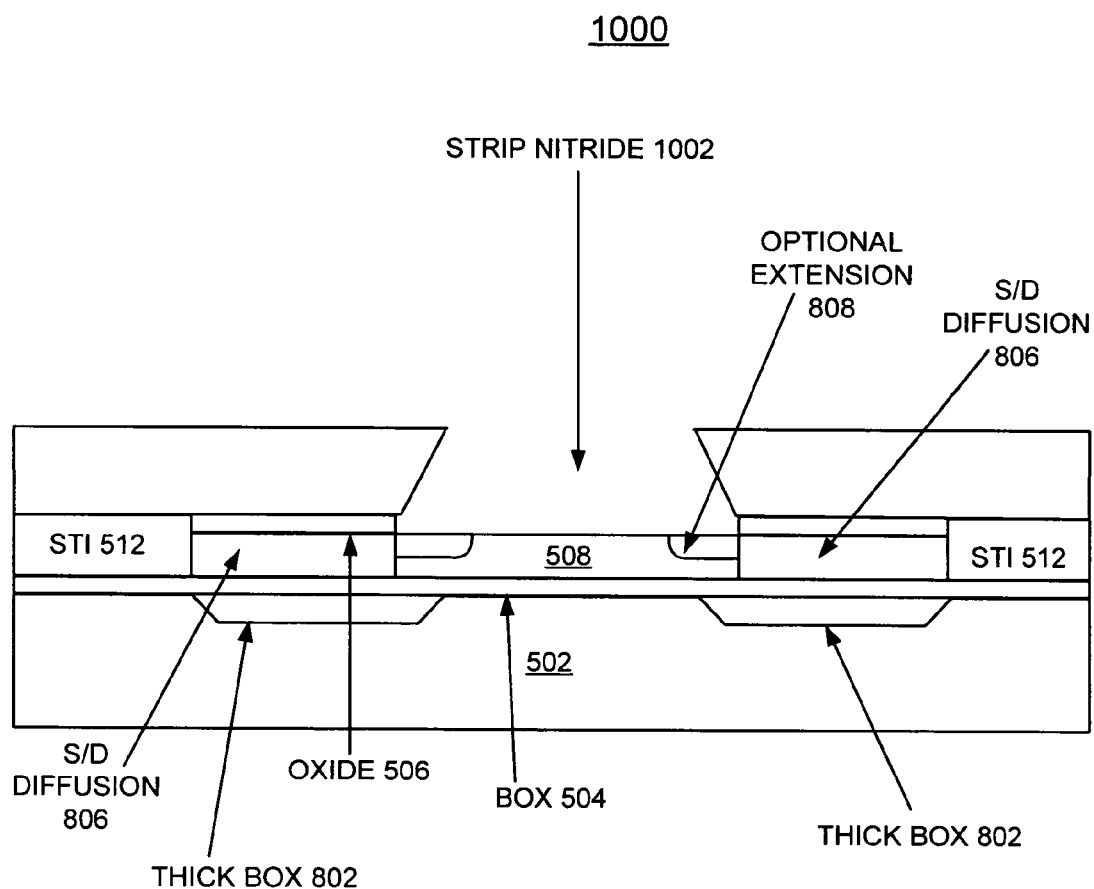

Referring now to FIG. 10, there is shown a next exemplary structure 1000 where in a next process strip nitride step 1002, the nitride cap 510, the pad oxide 506 previously under the nitride cap 510 and the optional Si$_3$N$_4$ spacers 804 are removed. When the spacer 804 is nitride then the gate length is longer than nominal, i.e. a weak gate. If spacer 804 is an oxide, then a minimum gate length will result. Both can be fabricated with a mask and two separate spacer depositions in FIG. 8.

Figure 11:
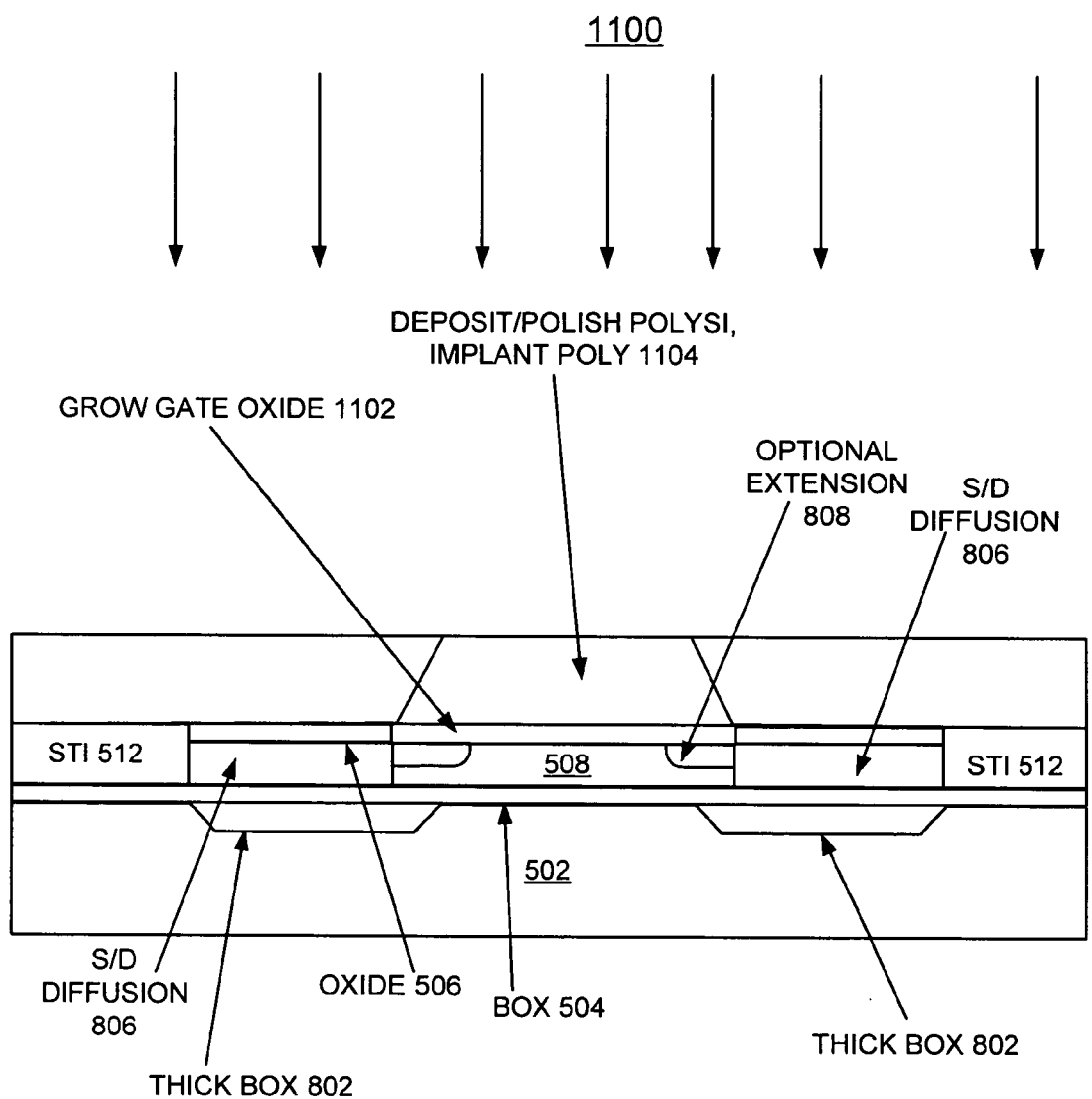

Referring now to FIG. 11, there is shown a next exemplary structure 1100 where a next process step to form a gate dielectric 1102 is performed. The gate dielectric 1102 is formed on the exposed surface of the layer channel region 108. Gate dielectric 1102 is formed utilizing a conventional thermal growing process. Alternatively, the gate dielectric may be formed by a conventional deposition process including, for example, CVD, plasma-assisted CVD or chemical solution deposition. A deposit/polish polysilicon and implant polysilicon step 1104 is performed for forming an elongated gate 1104 or weak gate 1104, as shown in FIG. 11.

Referring now to FIG. 12A, there is shown a next exemplary structure 1200 where in a next process remove mandrel step 1202 the oxide 902 is removed and optionally the source/drain 1204 and gate 1206 are implanted simultaneously. A remove pad oxide step indicated at 1208 removes the pad oxide 506 above the source/drain 1204. A pair of opposed sidewall spacers 1210 are formed for a weak gate, as shown in FIG. 12A.

Referring now to FIG. 12B, there is shown another next exemplary structure 1250 where in a next process remove mandrel step 1252 the oxide 902 is removed and optionally the source/drain 1254 and gate 1256 are implanted simultaneously. A remove pad oxide step indicated at 1258 removes the pad oxide 506 above the source/drain 1254. A pair of opposed sidewall spacers 1210 are formed for a standard gate 1256, as shown in FIG. 12B. To form the standard gate 1256, rather than the longer weak gate shown in FIG. 12A, in FIG. 8, no spacers need to be formed, instead of forming the nitride spacers 804 for the weak gate.

Advantages of this method as shown in FIGS. 5-7A, 7B, 8-12A and 12B are that both thick and thin active Si regions are supported, and the weak and standard gates are supported using the damascene gate process approach. An offset region to channel 508 is not required. The damascene gate process avoids any damage to the gate dielectric 1102 as the form gate dielectric step is performed after the thick BOX region 802 is completed. This damascene gate process may also integrate appropriate strain in S/D 1204 for mobility improvement for both PFET and NFET devices. As in the previous embodiment, conventional FEOL processing steps are used to complete the device.

Referring now to FIGS. 13-20A and 20B, there are shown exemplary steps for implementing enhanced silicon-on-insulator (SOI) transistors in accordance with still another preferred embodiment. A thick self-aligned BOX region under SOI source/drain diffusions while maintaining a thin box under the Si body for good backside coupling. This method utilizes a damascene gate to self-align the thick box regions to the diffusion areas.

Figure 13:
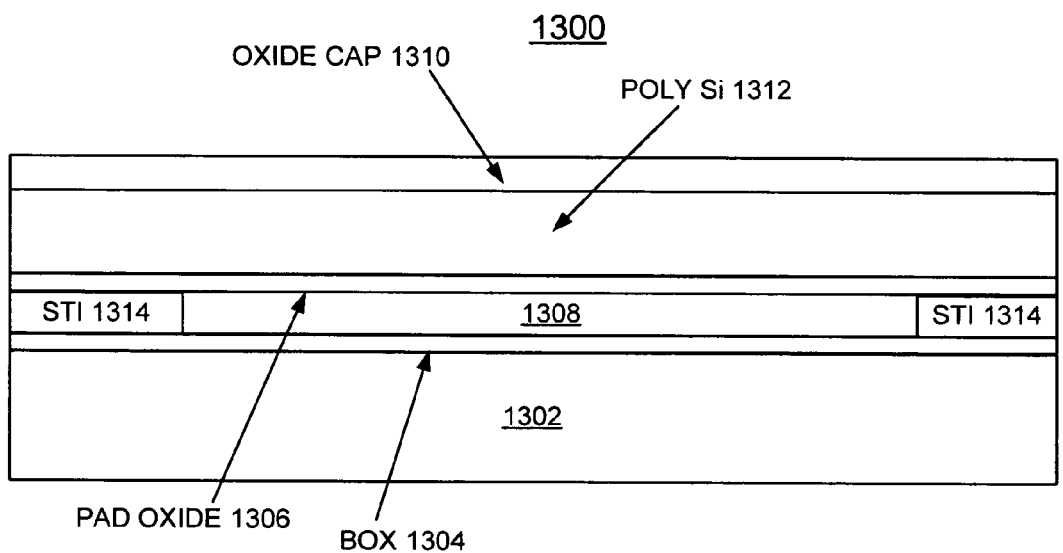

Referring now to FIG. 13, there is shown an exemplary structure generally designated by the reference character 1300 for forming enhanced SOI transistors of this preferred embodiment. Structure 1300 includes a substrate 1302, such as a silicon substrate 1302, a very thin buried oxide or oxynitride (BOX) layer 1304, a pad oxide layer 1306, an active layer or silicon layer 1308, a protective layer 1310, such as an oxide cap 1310, formed on a polysilicon layer 1312. A pair of thin shallow trench isolation (STI) regions 1314 is formed over the BOX layer 1304 adjacent the active layer or silicon layer 1308.

Figure 14:
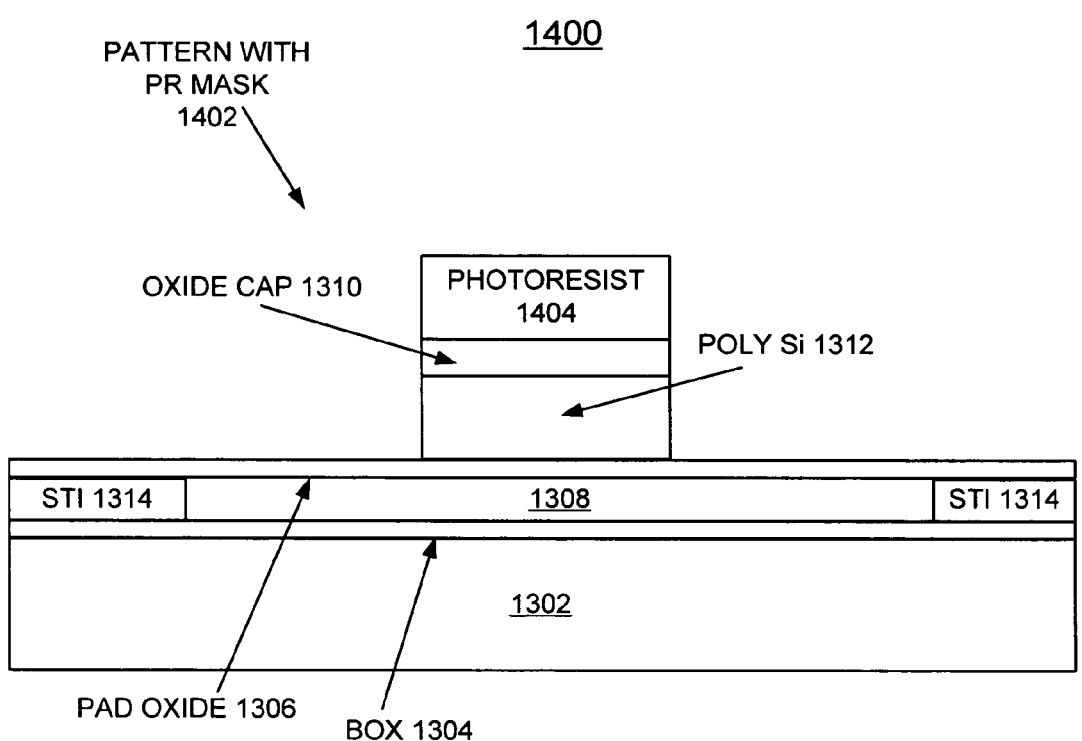

Referring now to FIG. 14, there is shown a next exemplary structure 1400 where in a next process step includes patterning with PR mask 1402, applying a photoresist layer 1404 to form the patterned oxide cap 1310 carried by the patterned polysilicon layer 1312.

Figure 15:
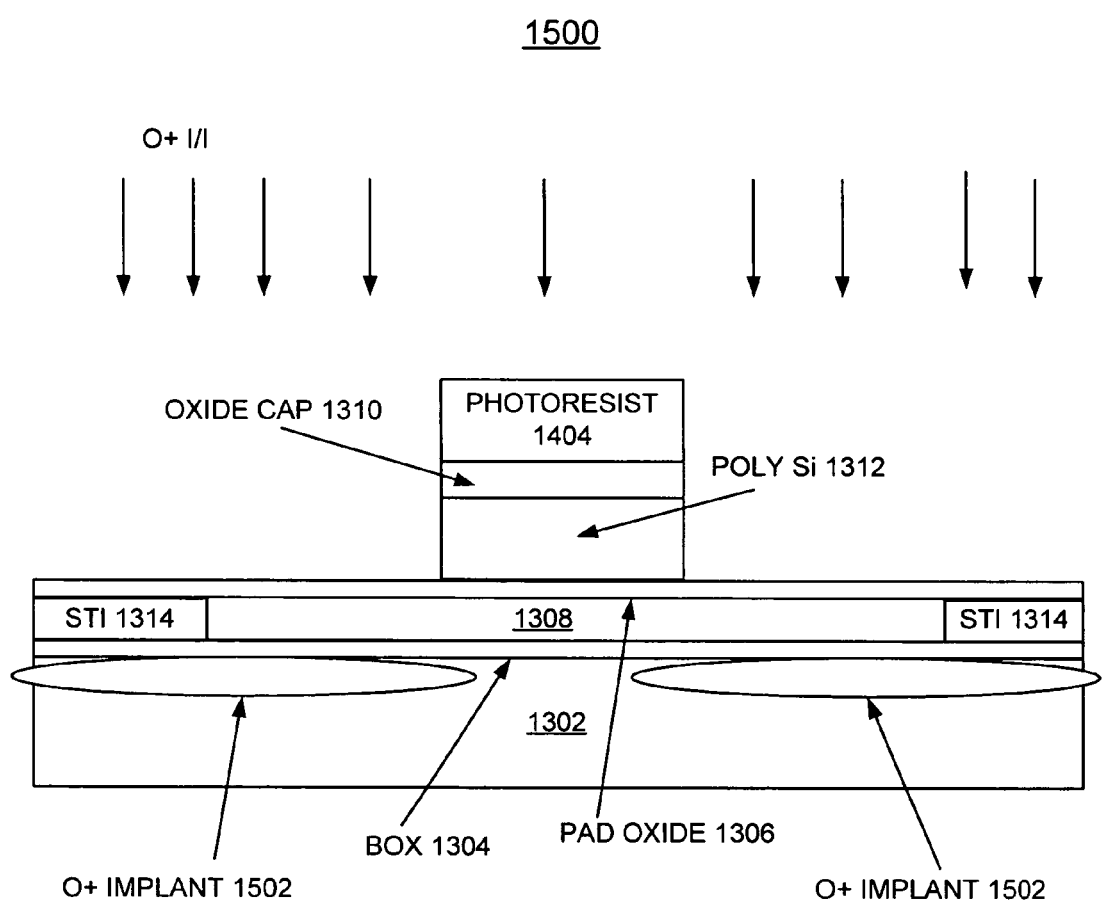

Referring now to FIG. 15, there is shown a next exemplary structure 1500 where an oxygen implant step is performed as indicated by arrows O+I/I to provide a pair of respective oxygen implants 1502 into the bulk substrate 1302 under regions that are later used for forming source and drain of the SOI transistor and also extending under the STI regions 1314. The oxygen implant process is self-aligned with respect to the polysilicon gate 1312. It should be understood that this oxygen implant step could also use the preferred method of the first embodiment where the oxygen implants are provided through a seed layer, such as the illustrated seed layers 202 in FIGS. 2 and 3.

Figure 16:
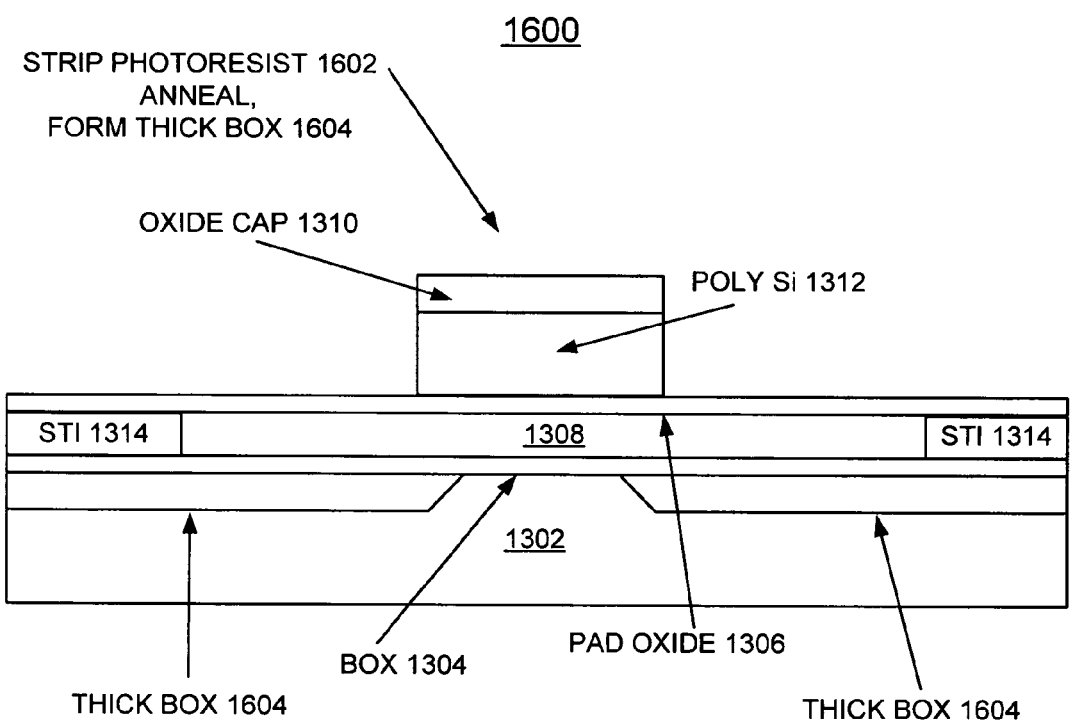

Referring now to FIG. 16, there is shown a next exemplary structure 1600 where a strip photoresist step 1602 is performed, removing the photoresist layer 1404. An anneal process is performed to convert the oxygen implants 1502 to a respective thick box region 1604. For example, the anneal process is performed to convert the oxygen implants 1502 to respective thick box region 1604 at a temperature between 600° C. to 1400° C., preferably in a temperature range between 900° C. and 1350° C., for a period of several minutes to 10 hours. The anneal process can be gentler than normal SIMOX, because silicon defects below the thin BOX layer 1304 under the diffusion are not critical for device operation. The thick box 1604 is located always beneath regions that form the source and drain, and also is defined such that the diffusion area capacitance component is negligible with circuit operation at nominal conditions.

Figure 17:
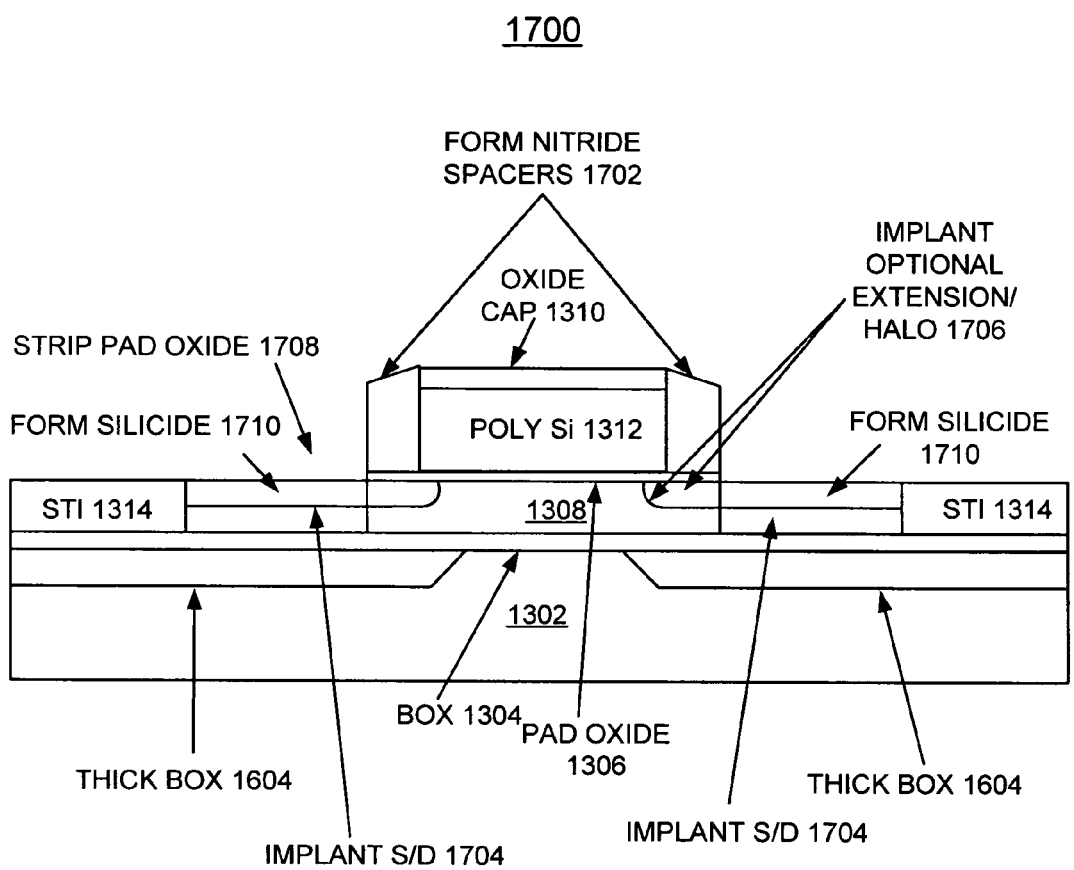

Referring now to FIG. 17, there is shown a next exemplary structure 1700 where a process step is performed to form nitride spacers 1702 on the pad oxide 1306 adjacent the polysilicon gate 1312. The source/drain 1704 are implanted and optionally an extension/halo 1706 are implanted. A strip pad oxide step indicated by 1708 is performed to remove pad oxide above the source/drain 1704 and a silicide 1710, such as TiSi$_2$, CoSi$_2$, and the like, is formed on the source/drain 1704.

Figure 18:
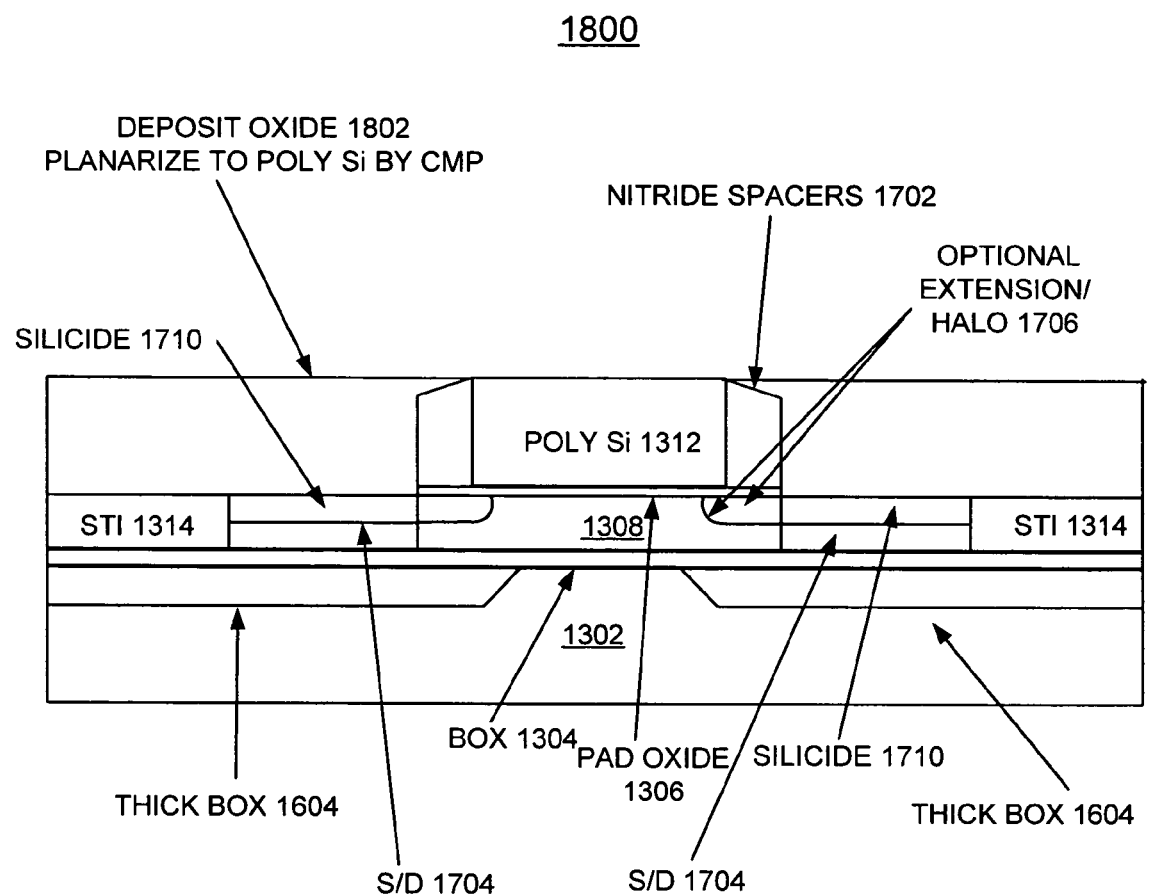

Referring now to FIG. 18, there is shown a next exemplary structure 1800 where a deposit oxide process step 1802 is performed to deposit an oxide over the STI regions 1314 and silicide 1710 and planarize to the polysilicon gate 1312, for example by chemical mechanical polishing (CMP). The exemplary structure 1800 provides the enhanced SOI transistor for normal MOS applications.

Figure 19:
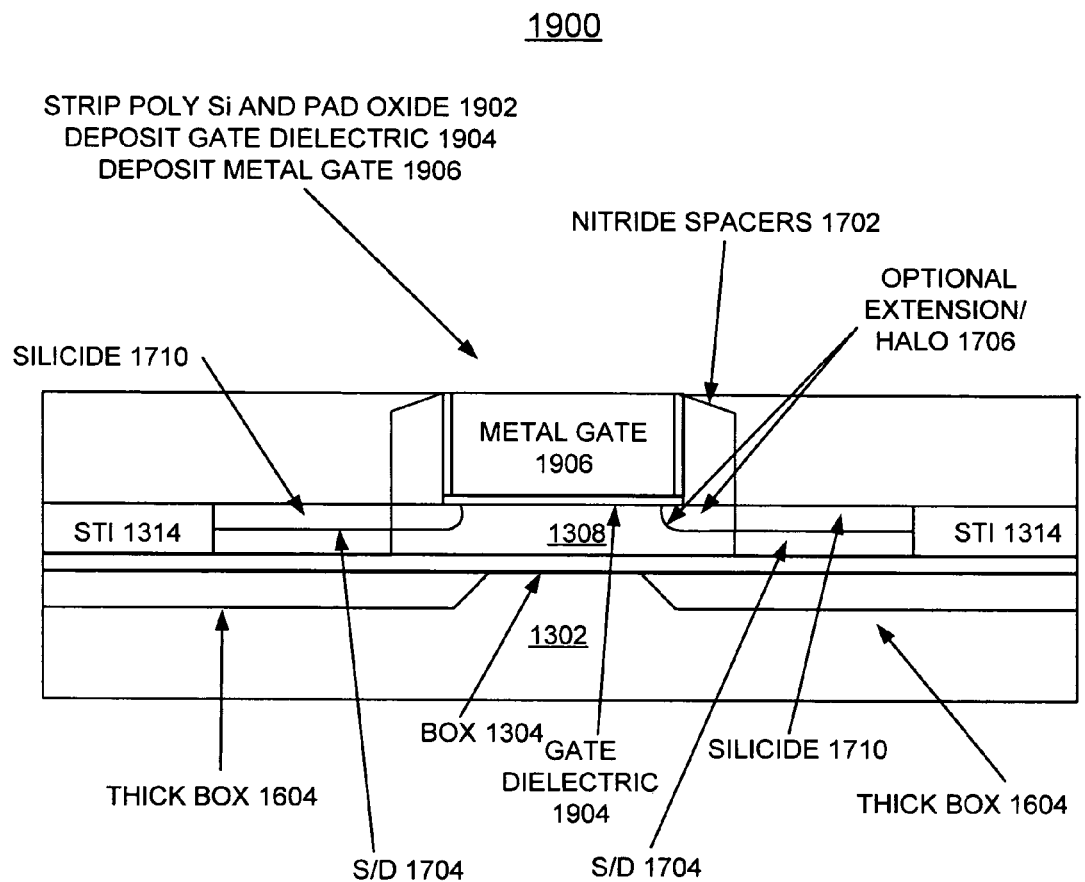

Referring now to FIG. 19, there is shown another optional additional exemplary structure 1900 where a strip polysilicon and pad oxide process step 1902 is performed to remove the polysilicon gate 1312 and the pad oxide 1304, shown in FIG. 18. Next a gate dielectric 1904 is deposited, such as an oxide, oxynitride, HfO2, and the like. Then a metal gate 1906 is deposited onto the gate dielectric 1904. The exemplary structure 1900 provides the enhanced SOI transistor for applications requiring a high-K gate dielectric 1904, that can be deposited when no further high temperature processes or processes at a temperature greater than 600° C., are required. The exemplary structure 1900 substantially eliminates tunnel current leakage with gate dielectric 1904 having, for example, an effective dielectric constant K in a range greater than 7 and less than 30, or $7 < K \leq 30$.

Using high-K dielectric process available in the art, and alternative work function gate materials such as a metal which are limited by materials and processes available in the art. For today's high-K and metal gate materials, the limit of post-gate stack formation high temperature processing is in the range of 450° C.-800° C. depending on the materials.

Figure 20A:
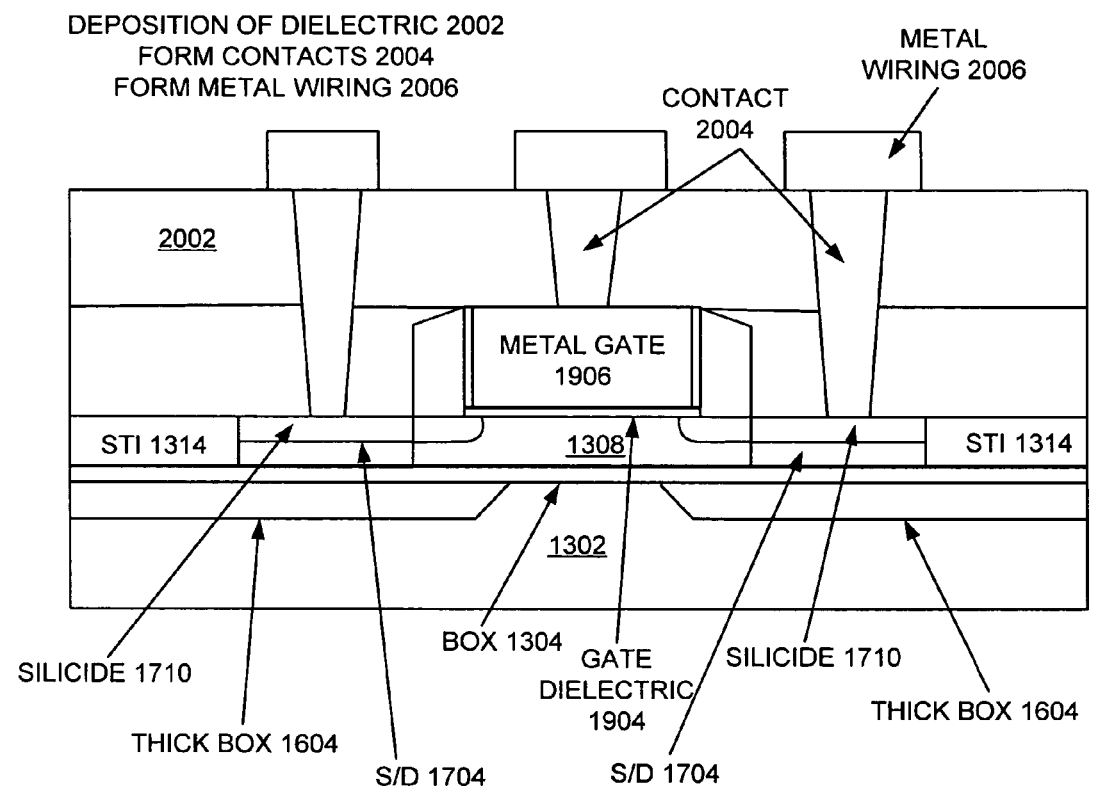

Referring now to FIG. 20A, an additional exemplary structure 2000 is shown following deposition of a dielectric layer 2002 and a plurality of contacts 2004 are formed to connect to silicide layers 1710 and metal gate 1906. A metal wiring layer 2006 is formed and connected to the plurality of contacts 2004. The advantages of this method are that both thick and thin BOX are supported. An offset region to channel is not required. The damascene gate process avoids any damage to the gate dielectric 1306 or 1904 as this step is performed after the thick BOX region is completed. This damascene gate process may also integrate appropriate strain in S/D 1704 for mobility improvement for both PFET and NFET devices.

Figure 20B:
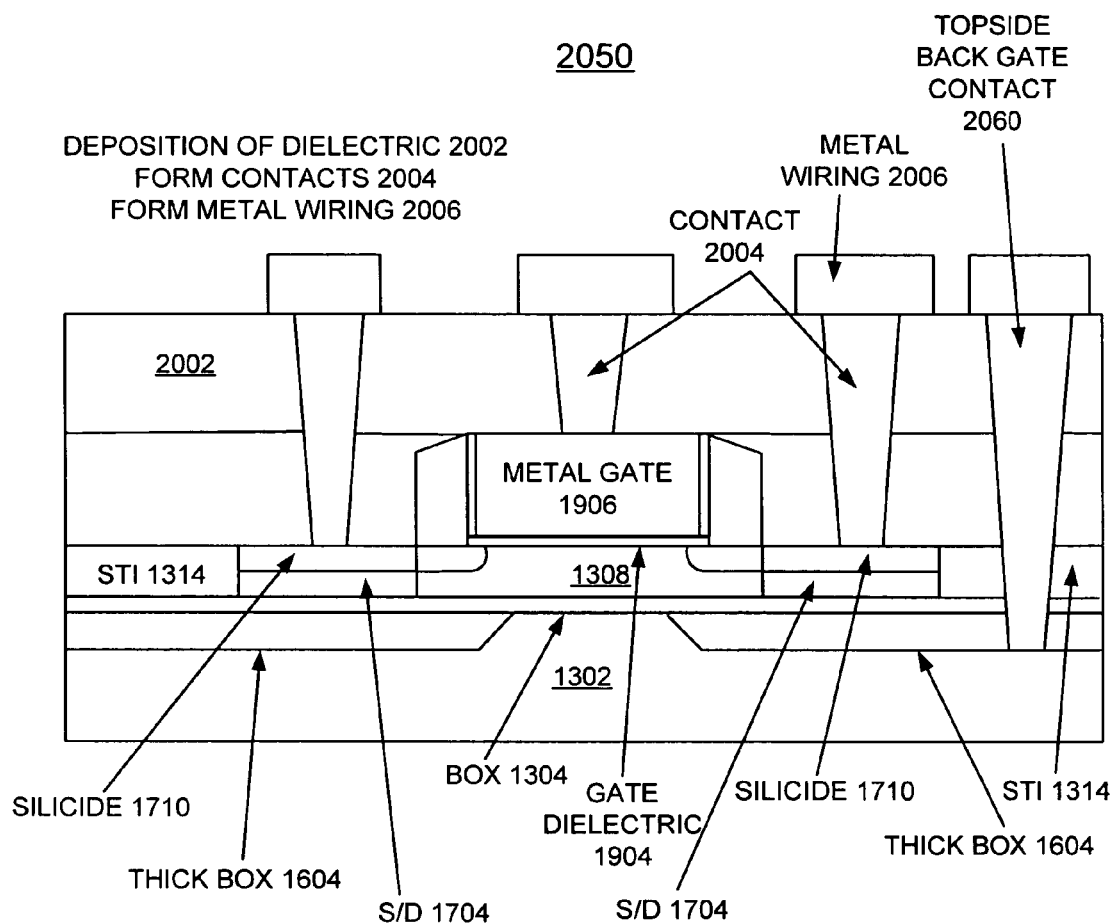

Referring now to FIG. 20B, an additional exemplary structure 2050 is shown that includes an independent contact 2060 formed to the substrate 1302, per transistor device enabling a new 3-Dimensional (3D) hybrid device to be created. 3D structure 2050 then includes a front gate 1906 having either a standard SiO$_2$ or high K dielectric, a back gate 1302 having an SiO$_2$ dielectric defined by BOX 1304. The device of 3D structure 2050 has three operating modes in which either the top transistor channel, the bottom transistor channel or the both channels are active. Both a new burn-In methodology and mixed mode device are provided.

By providing a high voltage, low performance oxide for BOX 1304 and a low voltage, high performance oxide for gate dielectric 1904 provides the ability to burn in the product with back gate 1302 at highly accelerated voltage levels.

The device of 3D structure 2050 can be used in a high performance mode either by utilizing active layer or silicon layer 1308 and back gate 1302 together, or just active layer or silicon layer 1308, or can be used in a low power mode by using just back gate 1302. We can also dynamically adjust the beta ratios of a circuit, where the beta ratio is defined as the ratio of NMOS to PMOS drive currents, by altering the voltage for the back gate 1302 and keeping a fixed voltage for active layer 1308. This hybrid device enables many enhanced features.

In accordance with features of the preferred embodiments, an optional step for implanting fluorine ions is performed, for example, after the oxygen implant and anneal steps of FIGS. 3 and 4; FIGS. 7A, 7B and 8; and FIGS. 15 and 16. The purpose of the fluorine ions implant step is for modulating the dielectric constant of the respective thick buried oxide 404, 802, 1604 as shown in FIGS. 4, 8, and 16. The fluorine ions implant step optionally following an anneal step shown in FIGS. 4, 8, and 16. The implanted fluorine ions are centered on the thick buried oxide 404, 802, 1604 as shown in FIGS. 4, 8, and 16.

While the present invention has been described with reference to the details of the embodiments of the invention shown in the drawing, these details are not intended to limit the scope of the invention as claimed in the appended claims.

What is claimed is:

1. A method of forming an enhanced silicon-on-insulator (SOI) transistor, comprising the steps of:
    providing a thin buried oxide (BOX) layer disposed on a substrate under SOI active transistor region including a device channel;
    forming a shallow trench isolation (STI) region over said thin buried oxide (BOX) layer around said SOI active transistor region;
    providing oxygen implants in said substrate under said thin buried oxide (BOX) layer and vertically spaced below SOI source/drain regions to be used for forming source and drain of the SOI transistor;
    processing said oxygen implants for providing a thick self-aligned buried oxide (BOX) region under said thin buried oxide (BOX) layer and vertically spaced below said SOI source/drain regions; and
    forming a diffusion layer defining said source and drain in said SOI source/drain regions and generating a selective strain in the source/drain regions to provide enhanced carrier mobility for either a P-channel device or an N-channel device.

2. A method of forming an enhanced SOI transistor as recited in claim 1 wherein the step of providing a thin BOX layer disposed on a substrate under SOI active transistor region including a device channel includes the step of forming a thin oxide layer in a bulk substrate.

3. A method of forming an enhanced SOI transistor as recited in claim 1 wherein the step of processing said oxygen implants for providing a thick self-aligned buried oxide (BOX) region under SOI source/drain diffusion regions includes the steps of forming a seed layer in said SOI source/drain regions.

4. A method of forming an enhanced SOI transistor as recited in claim 3 includes the step of performing an anneal process to convert said oxygen implants to silicon dioxide forming said thick self-aligned buried oxide (BOX) region; and performing fluorine ion implants centered on said respective BOX regions for modulating a dielectric constant of said BOX regions.

5. A method of forming an enhanced SOI transistor as recited in claim 1 wherein the step of forming a diffusion layer defining said source and drain in said SOI source/drain regions and generating a selective strain in the source/drain regions includes the step of using selective epitaxial growth of a silicon containing material in the source/drain regions to implement said selective strain.

6. A method of forming an enhanced SOI transistor as recited in claim 1 wherein the step of forming a diffusion layer defining said source and drain in said SOI source/drain regions and generating a selective strain in the source/drain regions includes the step of using selective epitaxial SiGe growth for P-channel devices to form the source/drain regions.

7. A method of forming an enhanced SOI transistor as recited in claim 1 wherein the step of forming a diffusion layer defining said source and drain in said SOI source/drain regions and generating a selective strain in the source/drain regions includes the step of using selective epitaxial SiC growth for N-channel devices to form the source/drain regions.

8. A method of forming an enhanced SOI transistor as recited in claim 1 includes the step of etching a silicon layer in the source/drain regions, leaving a seed layer.

9. A method of forming an enhanced SOI transistor as recited in claim 8 includes the step of performing the oxygen implant step through the seed layer before the source/drain are grown, whereby a required energy level for the oxygen implant step is minimized.

10. A method of forming an enhanced SOI transistor as recited in claim 9 further includes the step of growing a silicon containing material for the source/drain on the seed layer and generating said selective strain in the source/drain regions.

11. A method of forming an enhanced SOI transistor as recited in claim 1 includes the step of forming a front gate stack including a metal gate electrode and a high-K dielectric layer and a backgate stack including a $SiO_2$ dielectric layer and a conductive silicon layer.

12. A method of forming an enhanced SOI transistor as recited in claim 1 includes the steps of performing a damascene gate process whereby damage to the gate oxide is avoided.

13. A method of forming an enhanced SOI transistor as recited in claim 1 includes the steps of forming a gate electrode and a gate oxide after an oxygen implant step is performed.

14. A method of forming an enhanced SOI transistor as recited in claim 1 includes the steps of using a damascene gate to self-align the thick BOX region to the SOI source/drain diffusion regions.

15. A method of forming an enhanced SOI transistor as recited in claim 1 includes the steps of providing a sacrificial polysilicon region and a pad oxide for defining a damascene gate region.

16. A method of forming an enhanced SOI transistor as recited in claim 15 wherein the step of processing said oxygen implants for providing a thick self-aligned buried oxide (BOX) region includes the steps of performing an anneal process to convert said oxygen implants to silicon dioxide forming said thick self-aligned buried oxide (BOX) region.

17. A method of forming an enhanced SOI transistor as recited in claim 16 further includes the steps after forming a diffusion layer defining said source and drain in said SOI source/drain regions, stripping the sacrificial region and the pad oxide.

18. A method of forming an enhanced SOI transistor as recited in claim 17 further includes the steps of depositing a gate dielectric and depositing a gate electrode when no further high temperature processes are required.

19. A method of forming an enhanced SOI transistor as recited in claim 18 wherein said gate dielectric has a high dielectric constant k, wherein $7 < k \leq 30$.

* * * * *